(12) United States Patent
Lu et al.

(10) Patent No.: US 11,823,916 B2
(45) Date of Patent: Nov. 21, 2023

(54) APPARATUS AND METHOD OF SUBSTRATE EDGE CLEANING AND SUBSTRATE CARRIER HEAD GAP CLEANING

(71) Applicant: Applied Materials, Inc., Santa Clara, CA (US)

(72) Inventors: Wei Lu, Fremont, CA (US); Jimin Zhang, San Jose, CA (US); Jianshe Tang, San Jose, CA (US); Brian J. Brown, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 187 days.

(21) Appl. No.: 17/091,105

(22) Filed: Nov. 6, 2020

(65) Prior Publication Data

US 2022/0148892 A1 May 12, 2022

(51) Int. Cl.
*H01L 21/67* (2006.01)
*H01L 21/02* (2006.01)
*H01L 21/687* (2006.01)

(52) U.S. Cl.
CPC .. *H01L 21/67051* (2013.01); *H01L 21/02087* (2013.01); *H01L 21/67248* (2013.01); *H01L 21/68721* (2013.01)

(58) Field of Classification Search
CPC ......... H01L 21/02087; H01L 21/67051; H01L 21/67219; H01L 21/67248; H01L 21/68721
See application file for complete search history.

(56) References Cited

U.S. PATENT DOCUMENTS

| 6,287,178 B1 * | 9/2001 | Huynh | B08B 3/02 |
| | | | 451/73 |
| 6,402,598 B1 * | 6/2002 | Ahn | H01L 21/67051 |
| | | | 451/41 |
| 6,443,826 B1 * | 9/2002 | Yang | B24B 37/32 |
| | | | 451/388 |
| 7,044,832 B2 * | 5/2006 | Yilmaz | B24B 37/345 |
| | | | 451/5 |

(Continued)

FOREIGN PATENT DOCUMENTS

| CN | 111469046 A | 7/2020 |
| JP | 2018046260 A | 3/2018 |
| WO | 2008079449 A | 7/2008 |

OTHER PUBLICATIONS

International Search Report/ Written Opinion issued to PCT/US2021/053907 dated Jan. 10, 2022.

(Continued)

*Primary Examiner* — Duy Vu N Deo
*Assistant Examiner* — Christopher Remavege
(74) *Attorney, Agent, or Firm* — PATTERSON & SHERIDAN, LLP; Marcus Hammack

(57) ABSTRACT

The present disclosure relates to load cups that include an annular substrate station configured to receive a substrate. The annular substrate station surrounds a nebulizer located within the load cup. The nebulizer includes a set of energized fluid nozzles disposed on an upper surface of the nebulizer adjacent to an interface between the annular substrate station and the nebulizer. The set of energized fluid nozzles are configured to release energized fluid at an upward angle relative to the upper surface.

18 Claims, 5 Drawing Sheets

(56) References Cited

U.S. PATENT DOCUMENTS

| | | | |
|---|---|---|---|
| 7,052,376 B1* | 5/2006 | Kao | B24B 37/30 |
| | | | 451/65 |
| 9,174,324 B2* | 11/2015 | Umemoto | B24B 37/34 |
| 2006/0255016 A1* | 11/2006 | Svirchevski | B24B 37/042 |
| | | | 438/692 |
| 2010/0291841 A1* | 11/2010 | Sung | B24B 53/017 |
| | | | 451/177 |
| 2015/0017889 A1* | 1/2015 | Umemoto | B24B 37/34 |
| | | | 451/73 |
| 2016/0052104 A1* | 2/2016 | Ishibashi | B24B 37/10 |
| | | | 156/345.14 |
| 2020/0066549 A1* | 2/2020 | Ishibashi | B08B 3/08 |
| 2020/0234995 A1* | 7/2020 | Rangarajan | H01L 21/67748 |

OTHER PUBLICATIONS

Search Report for Taiwan Application No. 110140518 dated Feb. 3, 2023.
Office Action for Taiwan Application No. 110140518 dated Mar. 8, 2023.

* cited by examiner

APPARATUS AND METHOD OF SUBSTRATE EDGE CLEANING AND SUBSTRATE CARRIER HEAD GAP CLEANING

BACKGROUND

Field

Embodiments of the present disclosure generally relate to substrate processing, and more specifically to substrate processing tools and methods thereof.

Description of the Related Art

An integrated circuit is typically formed on a substrate by the sequential deposition of conductive, semiconductive or insulative layers on a silicon substrate. Fabrication includes depositing a filler layer over a non-planar surface, and planarizing the filler layer until the non-planar surface is exposed. A conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be needed to planarize a dielectric layer at the substrate surface for photolithography.

Chemical mechanical polishing (CMP) is one accepted method of planarization. This planarization method includes mounting the substrate on a carrier head or polishing head of a CMP apparatus. The exposed surface of the substrate is placed against a rotating polishing disk pad or belt pad. The carrier head provides a controllable load on the substrate to urge the device side of the substrate against the polishing pad. A polishing slurry, including at least one chemically-reactive agent, and abrasive particles if a standard pad is used, is supplied to the surface of the polishing pad.

The substrate is typically retained below the carrier head against a membrane within a retaining ring. Moreover a gap is present between an outer edge of the substrate and an inner perimeter of the retaining ring when the substrate is in the carrier head. In addition, a gap is present between an outer edge of the membrane and an inner perimeter of the retaining ring. These gaps and other areas proximate to the outer edge of the substrate can accumulate polishing slurry and organic residues during processing. These residues can remain on the substrate edge and/or dislodge during processing and cause defects to the substrate and affect the efficiency of the CMP apparatus. Thus, there is a need for a method of removing residue from the substrate edge and removing residue from the gaps in the carrier head surrounding the substrate. There is also a need for an apparatus for removing the residue from the substrate edge before the substrate is transferred off of the carrier head and for removing the residue from the gaps surrounding the membrane of the carrier head.

SUMMARY

In one embodiment, a load cup is provided having an annular substrate station configured to receive a substrate and a nebulizer located within the load cup and surrounded by the annular substrate station. The nebulizer has a set of energized fluid nozzles disposed on an upper surface of the nebulizer adjacent to an interface between the annular substrate station and the nebulizer. The set of energized fluid nozzles are configured to release energized fluid at an upward angle relative to the upper surface.

In another embodiment, a method of cleaning a chemical mechanical polishing system is provided including directing energized fluid from a set of energized fluid nozzles of a load cup at an edge of a substrate disposed in a carrier head. The carrier head has a retaining ring to retain the substrate below a membrane of the carrier head. The method includes unloading the substrate from the carrier head and directing the energized fluid from the set of energized fluid nozzles to a gap formed between an outer edge of the membrane and an inner perimeter of the retaining ring.

In another embodiment, a chemical mechanical polishing system includes a carrier head having a retaining ring to retain a substrate below a membrane of the carrier head the chemical mechanical polishing system includes a load cup having a set of energized fluid nozzles disposed on an upper surface of an outer portion of the load cup. The set of energized fluid nozzles are configured to direct energized fluid to a gap between an outer edge of the membrane and an inner perimeter of the retaining ring.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to load cups that are configured with energized fluid nozzles which expel tunable energized fluid jets to clean the edges of a substrate disposed in a carrier head before the substrate is unloaded from the carrier head without overheating the substrate. The energized fluid jets expelled from the energized fluid nozzles have characteristics that are favorable for penetrating and effectively cleaning narrow gaps in the carrier head between a hydrophobic membrane and an inner perimeter of a retaining ring of the carrier head. According to one or more embodiments of the disclosure, it has been discovered that certain properties of the energized fluid jets, such as one or more of a flat fan shape, high pressures, high temperatures, gas phase stream, solid, meltable particles for bombardment, sonic wave generation, and combination(s) thereof may be advantageously used for enhanced and quick cleaning. It has also been found that each of the energized fluid nozzles can be used in combination with respective fluid spray nozzles (e.g., deionized water spray nozzles) for improved control such as temperature control.

Figure 1:
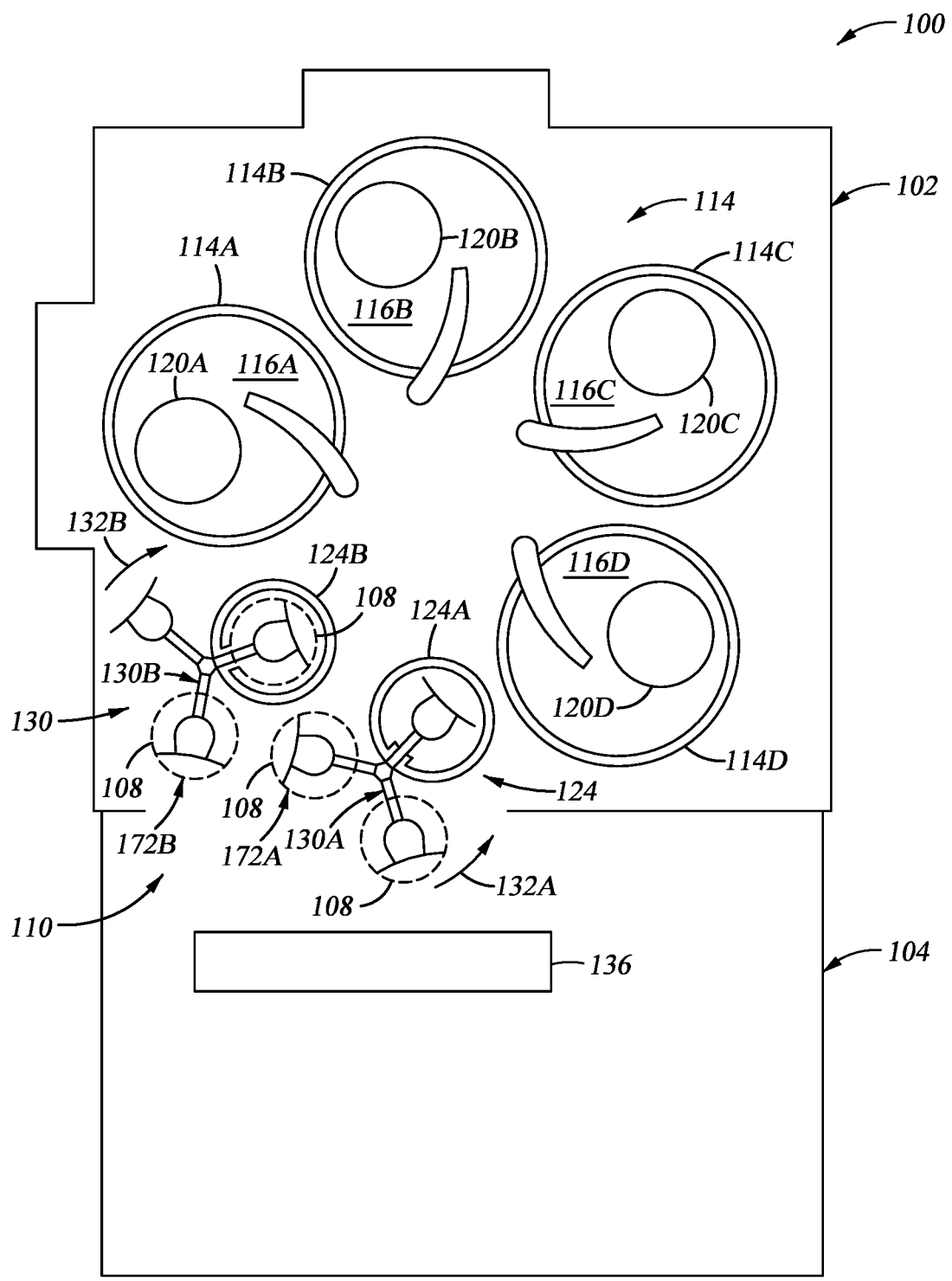
FIG. 1 depicts a top, plan view of a chemical mechanical polishing (CMP) system according to an embodiment.

FIG. 1 depicts a top, plan view of a chemical mechanical polishing (CMP) system 100 according to an embodiment disclosed herein. Although a CMP system is illustrated in FIG. 1 and described herein, the concepts disclosed herein may be applied to other substrate processing devices. The CMP system 100 includes a polishing section 102 and a cleaning and drying section 104 that process (e.g., wash and/or polish) substrates 108. The CMP system 100 includes other sections that perform other processes on the substrates 108. As used herein, substrates include articles used to make electronic devices or circuit components. Substrates include semiconductor substrates such as silicon-containing substrates, patterned or unpatterned substrates, glass plates, masks, and the like. A pass-through 110 is an opening between the polishing section 102 and the cleaning and drying section 104 that accommodates the transfer of the substrates 108.

The polishing section 102 includes one or more polishing stations 114, such as individual polishing stations 114A-114D. Each of the polishing stations 114 include a polishing pad, such as individual polishing pads 116A-116D. The polishing pads rotate against surfaces of the substrates 108 to perform various polishing processes. One or more slurries (not shown) are applied between the substrate 108 and the polishing pad 116A-116D to process the substrate.

The polishing section 102 includes a plurality of carrier heads 120 that maintain the substrates 108 against the polishing pads 116A-116D during polishing. Each of the polishing stations 114A-114D may include a single head, such as individual carrier heads 120A-120D. The carrier heads 120A-120D secure the substrates 108 therein as the carrier heads 120A-120D are transported to and from the polishing stations 114A-114D. For example, the carrier heads 120A-120D secure the substrates 108 therein as the carrier heads 120A-120D are transported between load cups 124 (e.g., individual load cups 124A, 124B) and the polishing stations 114A-114D. The load cups 124A, 124B transport the substrates 108 between the carrier heads 120A-120D and substrate exchangers 130 (e.g., individual exchangers 130A, 130B). A first substrate exchanger 130A rotates in a first direction 132A and a second exchanger 130B rotates in a second direction 132B, which may be opposite or the same as the first direction 132A.

The cleaning and drying section 104 includes a robot 136 that transfers the substrates 108 through the pass-through 110 to and from the substrate exchangers 130A, 130B at various access locations 172A, 172B. The robot 136 also transfers the substrates 108 between stations (not shown) in the cleaning and drying section 104 and the substrate exchangers 130A, 130B.

Figure 2A:
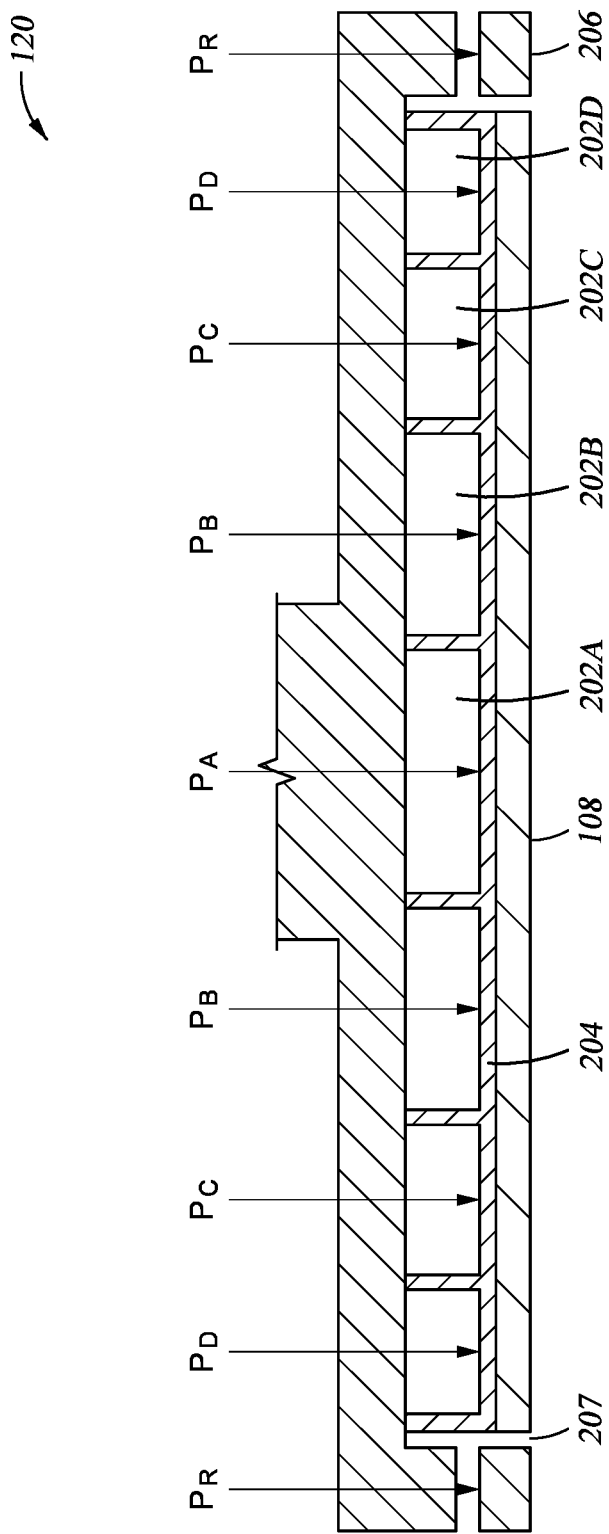
FIG. 2A depicts a partial side view of a polishing apparatus according to an embodiment.
Figure 2B:
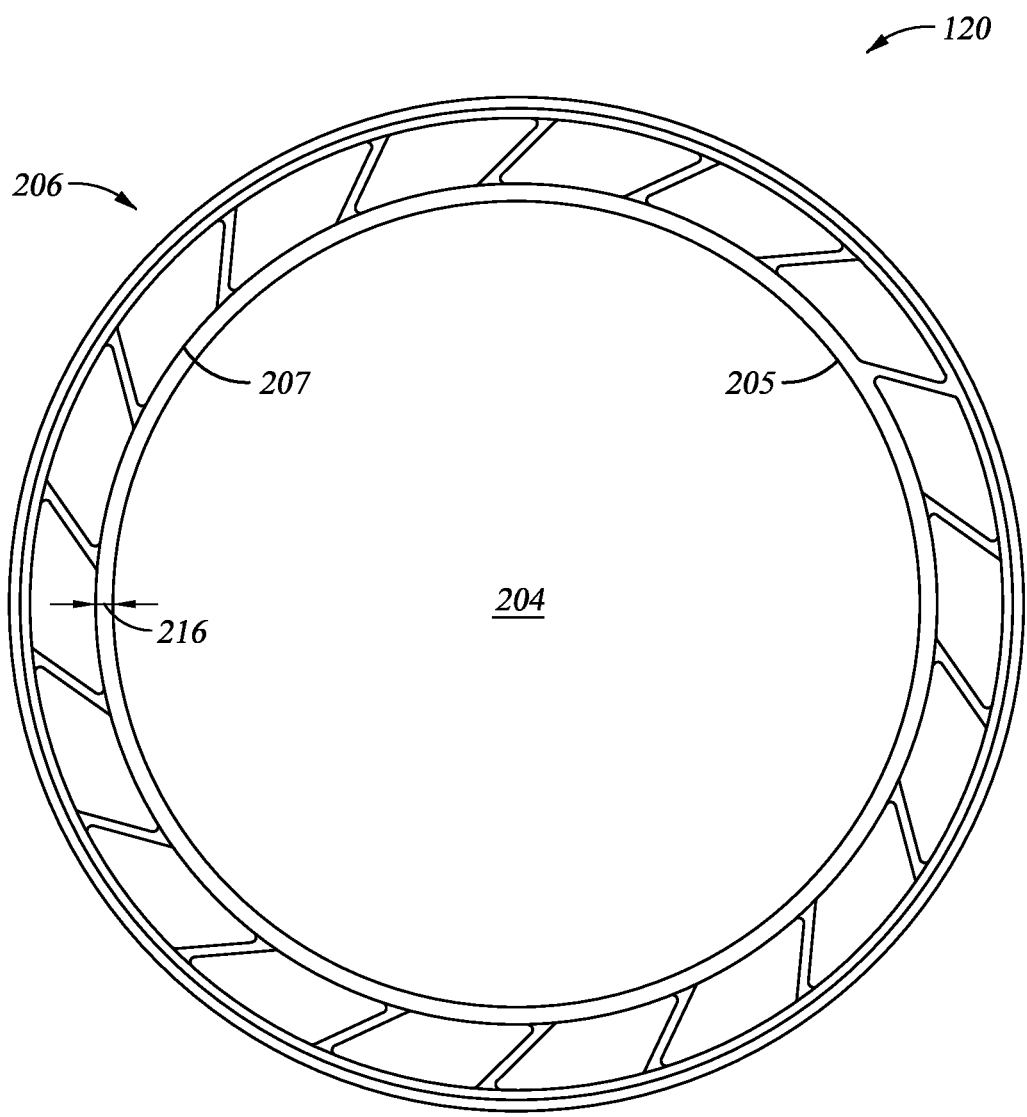
FIG. 2B depicts a bottom view of a polishing apparatus according to an embodiment.

FIGS. 2A and 2B depict a side view and a bottom view of the carrier head 120 according to some embodiments, which can be any of carrier heads 120A-120D in FIG. 1. The carrier head 120 includes a retaining ring 206 to retain the substrate 108 below a membrane 204. The membrane 204 is a flexible, hydrophobic membrane 204. The membrane outer perimeter 205 is surrounded by an inner perimeter 207 of the retaining ring 206. A gap 216 is formed between the inner perimeter 207 of the retaining ring 206 and the outer perimeter 205 of the membrane 204. In some embodiments, the gap 216 is about 0.5 mm to about 3 mm, such as about 1 mm to about 2 mm. The carrier head 120 includes one or more independently controllable pressurizable chambers (e.g., 202A, 202B, 202C, 202D) defined by the membrane 204. Each of the pressurizable chambers have associated pressures (PA, PB, Pc, and PD), and PR refers to the pressure exerted on the retaining ring 206 during processing. During processing, as the carrier head 120 rotates the substrate 108 while pressing it against the polishing pad (e.g., 116A-116D), polishing slurry, debris and residue can accumulate on the substrate 108 edge, the substrate bevel areas, and other locations such as within the gap 216.

Without being bound by theory, it is believed that because the membrane 204 is hydrophobic, the capillary and/or meniscus forces surrounding the outer perimeter 205 of the membrane 204 prevent conventional rinsing water, e.g., deionized (DI) water, from readily penetrating these gaps and features. The residue and particles can build up over time and be released during processing potentially causing scratches on the substrate 108. One solution may be to rinse the membrane 204 with the membrane 204 facing upwards; however, this process is not conventionally used in the industry at least because it would affect throughput and cause water to bead up. A rinse process with the membrane 204 facing down is unable to wet the hydrophobic membrane surfaces and is limited in effectiveness for cleaning. It has been discovered that using a high pressure steam dislodges slurry residues and particles by using both kinetic and thermal energies. In some embodiments, the steam is effective for cleaning the gaps in the carrier head 120 both when the substrate 108 is not in place, and when the substrate 108 is retained in the carrier head 120.

Figure 3A:
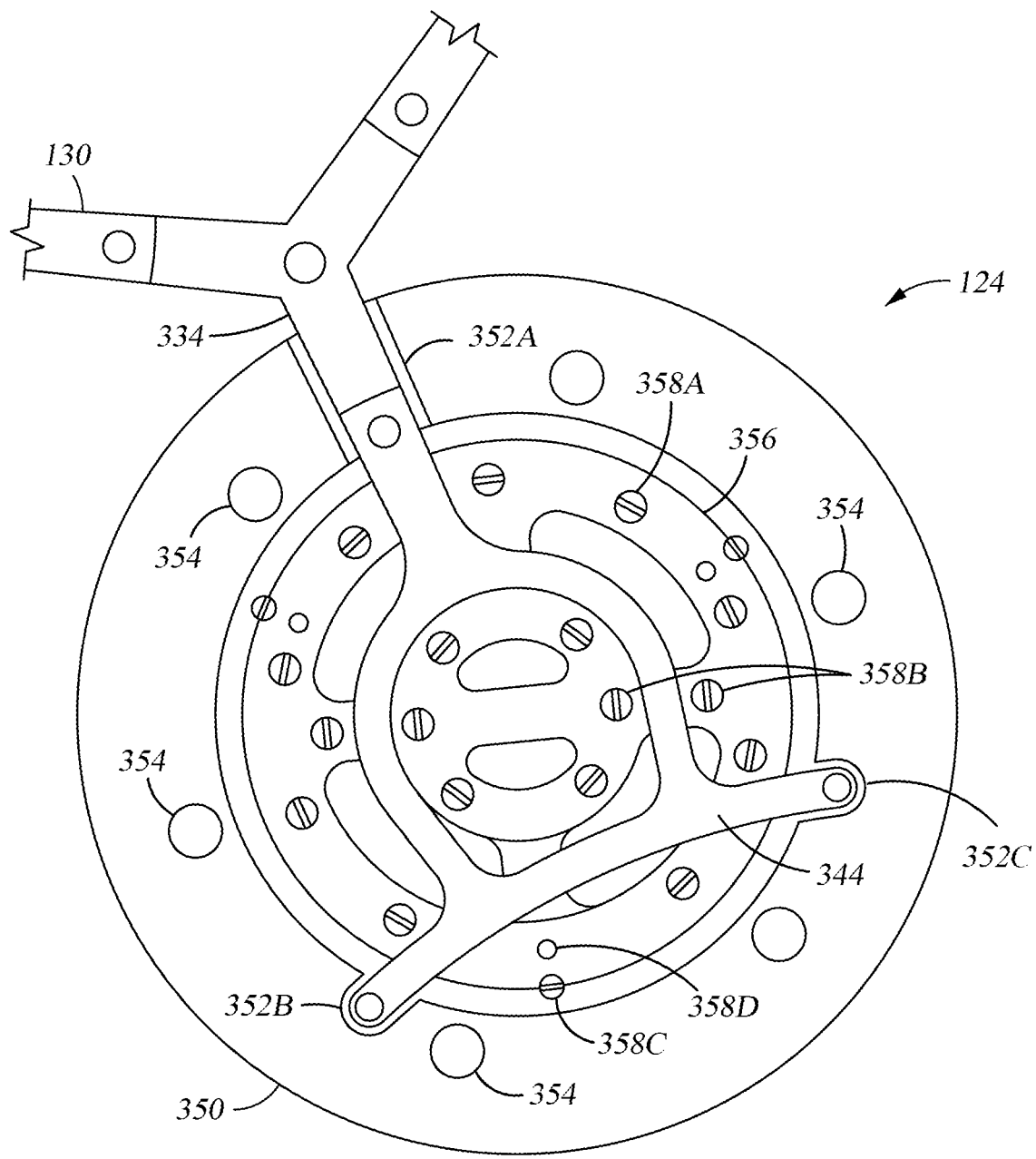
FIG. 3A depicts a top, plan view of a load cup according to an embodiment.

FIG. 3A depicts a top, plan view of the load cup 124 (e.g., 124A or 124B) according to an embodiment. The load cup 124 includes a substrate station 350 that has an annular shape. The substrate station 350 moves vertically to place substrates onto a blade 334 of the substrate exchanger 130 (e.g., 130A, 130B) and to remove the substrates 108 from the blade 334. The blade 334 is rotatable to the access location 172A, 172B for loading and unloading of the substrate 108 by the robot 136 (FIG. 1).

The substrate station 350 includes notches (e.g., 352A, 352B, 352C) to receive the blade 334. The distal end 344 of the blade is received by notches 352B and 352C. The proximate end of the blade 334 is received by notch 352A. The substrate 108 rests on raised features of the substrate station 350. As the substrate station 350 moves in an upward direction and removes the substrate 108 from the blade 334, the substrate 108 is positioned within a plurality of pins 354, which create a pocket to center the substrate 108.

The load cup 124 includes a nebulizer 356 having a plurality of various nozzles (e.g., 358A, 358B, 358C, 358D) configured to spray fluids (e.g., deionized water) onto the blade 334, a substrate 108 (not shown in FIG. 3A) on the blade 334, a substrate on the carrier head 120, and/or a carrier head 120 (not shown in FIG. 3A) located above the load cup 124. The nebulizer 356 includes a set of first nozzles 358A disposed around the outer portion of the nebulizer 356, for example, to rinse the substrate 108, and a set of second nozzles 358B disposed in an array along a diameter of the nebulizer 356, for example, to rinse the membrane 204 of the carrier head 120, when respectively positioned over the load cup 124. The nebulizer 356 includes a set of third nozzles 358C on the outer portion of the nebulizer 356 configured to spray portions of the carrier head 120, such as the gap 216 between the outer perimeter 205 of the membrane 204 and the inner perimeter 207 of the retaining ring 206, when the carrier head 120 is positioned over the load cup 124, with or without the substrate 108. The third nozzles 358C (e.g., spray nozzles) are also configured to spray an outer edge of the substrate 108, while retained in the carrier head 120, such as a gap between the outer edge of the substrate 108 and the inner perimeter 207 of the retaining ring 206. The third nozzles 358C are coupled to a rinse solution, such as deionized water at room temperature, such as about 10° C. to about 40° C. Each of the third nozzles 358C are coupled to atomizers.

The nebulizer 356 includes a set of fourth nozzles 358D (e.g., energized fluid nozzles). Each of the fourth nozzles 358D are disposed proximate to each third nozzle 358C on an upper surface of the nebulizer 356 at an outer portion of the nebulizer 356. In some embodiments, the energized fluid is deionized water (DIW), DIW and nitrogen, DIW and clean dry air (CDA), water ice particles and nitrogen, water ice particles and CDA, carbon dioxide ice, DIW energized with ultrasonic or megasonic generators, or combination(s) thereof. Without being bound by theory, it is believed that certain mixtures including ice particles can be used to bombard and dislodge debris within small voids and gaps. The energized fluid is gas phase fluid and/or a mixed phase fluid, such as vapor and/or steam. The temperature of the energized fluid, such as steam is about 80° C. to about 150° C., such as about 100° C. to about 120° C., such as a temperature at or above a saturation temperature of the fluid. The pressure applied to energize the fluid is about 30 psi to about 140 psi, such as about 40 psi to about 50 psi. Other pressures and temperatures are also contemplated, such as for dry ice and other energized fluids.

In some embodiments, the fluid is energized by pressurizing a fluid, acoustically energized (e.g., via acoustic cavitation), pneumatically assisted (e.g., using liquid mixed with a pressured gas), or combination(s) thereof. Other methods and combinations are also possible. Acoustic cavitation includes ultrasonically or megasonically energizing the fluid to dislodge residue and debris. Acoustically energizing fluid uses a piezoelectric transducer (PZT) operating in a frequency range from a lower ultrasonic range (e.g., about 20 KHz) to an upper megasonic range (e.g., about 2 MHz). Other frequency ranges can be used. The shape of a suitable acoustic energy source generator (e.g., a PZT) is rectangular. The acoustic source generator is coupled to the fourth nozzle 358D.

Figure 3B:
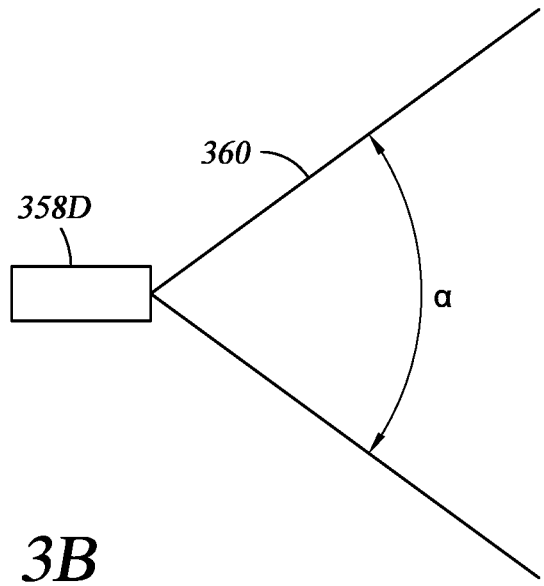
FIG. 3B depicts a schematic side view of a spray pattern for a nozzle according to an embodiment.

The fourth fluid nozzles 358D are oriented upwards, perpendicular (e.g., about 90 degrees) to the upper surface of the nebulizer 356. Other angles relative to the upper surface of the nebulizer 356 is also contemplated, such as about 45 degrees to about 100 degrees, in which 45 degrees is angle that oriented radially outward relative to the nebulizer 356. Additionally each of the fourth fluid nozzles 358D are configured to direct fluid in a flat fan jet (e.g., 360 shown in FIG. 3B). FIG. 3B depicts a schematic side view of a spray pattern of a flat fan jet 360 for the third nozzle 358C and/or the fourth nozzle 358D according to some embodiments. The flat fan jet is substantially parallel with a portion of an inner perimeter of the annular substrate station 350 and a jet angle α pivoting at a tip of the fourth fluid nozzle 358D from a first edge to a second edge of the flat fan jet is about 30 degrees to about 50 degrees, such as about 40 degrees. In some embodiments, the nebulizer 356 includes about 1 to about 5 fourth fluid nozzles 358D, such as 2, 3, or 4 fourth fluid nozzles 358D. Each of the fourth fluid nozzles 358D are equally spaced around the outer portion of the nebulizer 356. In some embodiments, the nebulizer 356 includes about 1 to about 5 third nozzles 358C, and each fourth fluid nozzle 358D is disposed proximate to a respective third nozzle 358C.

Figure 4:
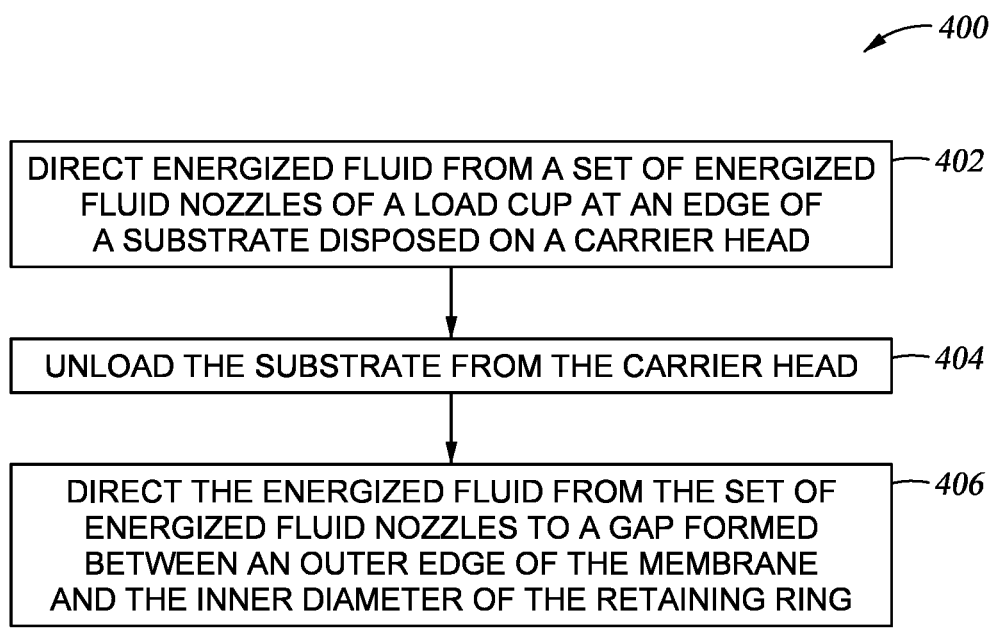
FIG. 4 depicts a flow diagram of a method for processing a substrate according to an embodiment.

FIG. 4 includes a flow diagram of a method for processing substrate. The method 400 includes, an operation 402, directing energized fluid from a set of energized fluid nozzles (e.g., 358D) of a load cup (e.g., 124) at an edge of a substrate (e.g., 108) disposed in a carrier head (e.g., 120). The carrier head 120 includes the retaining ring 206 to retain the substrate 108 below the membrane 204 of the carrier head 120. The substrate 108 edge is maintained at a temperature of about 60° C. to about 70° C., as measured from outside of the carrier head 120. In some embodiments, after polishing the substrate 108 in the polishing section 102, the substrate 108 is cooled to room temperature, such as about 20° C. to about 40° C. during rinsing and/or removing the substrate 108 from the polishing section 102. It is believed that maintaining a low substrate 108 temperature, reduces a potential for corrosion during substrate transfer. The method described herein controls substrate temperature during cleaning, such as by localizing energized fluid to the substrate edge areas. In some embodiments, the energized fluid (e.g., steam) is simultaneously directed to the edge of the substrate 108 while spraying DI water from spray nozzles (e.g., 358C) at the edge of the substrate 108. In some embodiments, the DI water is sprayed immediately after the energized fluid is directed to the edge of the substrate 108. The combined jet of the DI water and the energized fluid is controlled by adjusting the pressure of the energized fluid and the amount of water sprayed. In particular, a temperature of the combined jet is controlled to maintain the temperature of the substrate 108 below about 70° C. It is believed that maintaining a substrate 108 temperature below about 70° C. reduces undesirable effects on the substrate 108. Residue and debris is dislodged from the edge of the substrate 108 without overheating the substrate and portions of the substrate carrier head 120 such as the retaining ring 206. Managing temperature reduces the risk of material degradation of the substrate 108 and carrier head 120. Spraying water also acts to rinse away the dislodged residue and debris. In some embodiments, the energized fluid is directed to the substrate edge while the substrate 108 is in the carrier head 120 and rotating with the carrier head. The substrate 108 is secured to the carrier head 120 by application of a vacuum pressure to the membrane. The low clearance between the inner perimeter of the membrane and the substrate edge in combination with the hydrophobic properties of the membrane make it difficult to clean the substrate edge and bevel areas using conventional methods. The methods described herein provides an energized fluid having a fan jet shape and angle that is directed to the substrate edge while the substrate is secured to the carrier head 120 for enhanced cleaning.

In operation 404, the substrate 108 is unloaded from the carrier head 120, such as by loading the substrate 108 onto a substrate exchanger (e.g., 130A, 130B) and rotating the substrate exchanger. After the substrate 108 is removed from the carrier head, the load cup 124 is returned to a position proximate the carrier head 120, and energized fluid is directed to the empty carrier head 120 at the gap 216 formed between the outer perimeter 205 of the membrane 204 and the inner perimeter 207 of the retaining ring 206 in operation 406. In some embodiments, DI water is sprayed immediately after the energized fluid to rinse away any dislodged residue and debris.

Thus, the present disclosure relates to load cups that are configured with energized fluid nozzles which expel tunable energized fluid jets to clean the edges of a substrate disposed in a carrier head before the substrate is unloaded from the carrier head without overheating the substrate. The energized fluid jets expelled from the energized fluid nozzles have characteristics that are favorable for penetrating and effectively cleaning narrow gaps in the carrier head between a hydrophobic membrane and an inner perimeter of a retaining ring of the carrier head. Each of the energized fluid nozzles can be used in combination with respective fluid spray nozzles (e.g., deionized water spray nozzles) for improved control such as temperature control.

What is claimed is:

1. A method of cleaning a chemical mechanical polishing system comprising:
    directing a first fluid from a first array of fluid nozzles of a load cup to an edge of a substrate and a gap between the substrate and an inner perimeter of a retaining ring disposed within a carrier head when the substrate is positioned on a membrane within the carrier head and the carrier head is positioned above the first array of fluid nozzles, wherein the first fluid comprises steam;
    simultaneously directing a second fluid from a second array of fluid nozzles of the load cup to the edge of the substrate and the gap between the substrate and the inner perimeter of the retaining ring while directing the first fluid from the first array of fluid nozzles, wherein the second fluid comprises deionized water and is configured to maintain the substrate below 70° C.;
    unloading the substrate from the carrier head;
    directing the first fluid from the first array of fluid nozzles to a gap between an outer edge of the membrane and the inner perimeter of the retaining ring; and
    after directing the first fluid to the gap between the outer edge of the membrane and the inner perimeter of the retaining ring, directing the second fluid to the gap between the outer edge of the membrane and the inner perimeter of the retaining ring.

2. The method of claim 1, wherein the first array of fluid nozzles is coupled to a steam source, wherein the fluid from the first array of fluid nozzles is configured to be above a saturation pressure and a saturation temperature for a steam from the steam source.

3. The method of claim 1, wherein the substrate is maintained at a temperature of about 60° C. to below about 70° C.

4. The method of claim 1, wherein
    the second fluid is at about 10° C. to about 40° C., and
    forms a flat fan jet.

5. The method of claim 1, wherein the second array of fluid nozzles form a tunable jet, or a flat fan jet, wherein a flat portion of the flat fan jet is substantially parallel with an inner perimeter of the carrier head.

6. The method of claim 1, wherein directing the first and second fluids removes residues from the carrier head.

7. The method of claim 1, wherein the first fluid from the first array of fluid nozzles further comprises deionized water and nitrogen gas, deionized water and clean dry air (CDA), ultrasonic deionized water, megasonic deionized water, or combination(s) thereof.

8. The method of claim 1, wherein the substrate is secured on the carrier head under vacuum pressure applied to the membrane of the carrier head while the first fluid from the first array of fluid nozzles is directed at the edge of the substrate and the gap between the substrate and the inner perimeter of the retaining ring.

9. The method of claim 1, wherein the load cup comprises a substrate station configured to align the substrate.

10. The method of claim 1, wherein the first array of fluid nozzles is coupled to a sonic generator configured to energize the first fluid of the first array of nozzles.

11. The method of claim 1, wherein the second array of nozzles are configured to direct the second fluid into a flat fan jet, the flat fan jet comprising an angle of about 30 degrees to about 50 degrees.

12. The method of claim 1, wherein the first array of nozzles and the second array of nozzles are disposed on an upper surface of a nebulizer, wherein the first array of nozzles are oriented about perpendicular to the upper surface of the nebulizer.

13. The method of claim 1, wherein the second array of nozzles are configured to direct the second fluid into a flat fan jet that is substantially parallel with an inner perimeter of the retaining ring.

14. A method of cleaning a chemical mechanical polishing system comprising:
    positioning a substrate disposed in a carrier head above a load cup, wherein
        the carrier head comprises:
            a retaining ring disposed within the carrier head;
            a membrane disposed radially inward of the retaining ring, configured to hold the substrate; and
            a gap disposed at an inner perimeter of the retaining ring and an outer perimeter of the membrane;
        the load cup comprising:
            a nebulizer disposed centrally within the load cup, beneath a top surface of the load cup;
            a first array of fluid nozzles disposed on the nebulizer, wherein the first array of fluid nozzles is configured to direct a first fluid towards the carrier head;
            a second array of fluid nozzles disposed on the nebulizer, wherein the second array of fluid nozzles is configured to direct a second fluid towards the gap, the second fluid comprising steam; and
            a third array of fluid nozzles disposed on the nebulizer, wherein the third array of fluid nozzles is configured to direct a third fluid towards the gap, the third fluid configured to maintain the substrate below 70° C.;
    directing the first fluid from the first array of fluid nozzles toward the carrier head;
    simultaneously directing the second and third fluids fluid from the second array of fluid nozzles and third array of fluid nozzles to the gap;
    unloading the substrate from the carrier head; and
    directing the first fluid from the first array of fluid nozzles to the carrier head.

15. The method of claim 14, wherein the third array of fluid nozzles sprays a flat fan jet pattern substantially parallel with an inner perimeter of the retaining ring.

16. The method of claim 14, wherein the second fluid further comprises deionized water and nitrogen gas, deionized water and clean dry air (CDA), ultrasonic deionized water, megasonic deionized water, or combination(s) thereof.

17. The method of claim 15, wherein the flat fan jet pattern comprises an angle of about 30 degrees to about 50 degrees.

18. The method of claim 1, wherein
    the first array of fluid nozzles comprises a first rinse array of nozzles and a second rinse array of nozzles, the first rinse array of nozzles is disposed along a diameter of the load cup,
the second rinse array of nozzles disposed radially around the load cup, and
the load cup is disposed beneath the carrier head.

\* \* \* \* \*